United States Patent [19]

Sunakawa

[11] Patent Number: 4,845,049
[45] Date of Patent: Jul. 4, 1989

[54] DOPING III-V COMPOUND SEMICONDUCTOR DEVICES WITH GROUP VI MONOLAYERS USING ALE

[75] Inventor: Haruo Sunakawa, Tokyo, Japan

[73] Assignee: NEC Corporation, Tokyo, Japan

[21] Appl. No.: 173,808

[22] Filed: Mar. 28, 1988

[30] Foreign Application Priority Data

Mar. 27, 1987 [JP] Japan .................................. 62-75362

[51] Int. Cl.$^4$ .......................................... H01L 21/205
[52] U.S. Cl. .............................. 437/81; 148/DIG. 40; 148/DIG. 65; 148/DIG. 10; 156/613; 357/23.2; 437/111; 437/126; 437/912; 437/965
[58] Field of Search .................... 148/DIG. 40, 41, 65, 148/72, 110, 169, 33, 33.1, 33.4; 156/610-615; 357/23.2, 16, 15; 437/81, 108, 111, 126, 912, 965, 971

[56] References Cited

U.S. PATENT DOCUMENTS 4,058,430 11/1977 Suntola et al. ....................... 437/105

OTHER PUBLICATIONS

Ozeki et al., "Growth of AlGaAs Using a Pulsed Vapor Phase Method", IEEE Solid State Devices and Materials, 1987, pp. 475-478.
Kobayashi et al., "Flow-Rate Modulation Epitaxy of GaAs," Inst. Phys. Conf. Ser. No. 79, Chapter 13, 1985, pp. 737-738.
Pessa et al., "Atomic Layer Epitaxy . . . ," J. Appl. Phys. 54(10), Oct. 1983, pp. 6047-6050.
Erdman F. Schubert, A Fischer, and Klaus Ploog *The Delta-Doped Field Effect Transistor* IEEE Transactions on Electron Devices, vol. ED-33, No. 5, May 1986.
*GaAS Atomic Layer Epitaxy by Hydride VPE* by Usui and Sunakawa, Japanese Journal of Applied Physics, vol. 25, No. 3, Mar. 1986.
Tuomo Suntola *Atomic Layer Epitaxy,* Extended Abstracts of the 16th (1984 International) Conference on Solid State Materials and Devices.

*Primary Examiner*—Brian E. Hearn
*Assistant Examiner*—William D. Bunch
*Attorney, Agent, or Firm*—Helfgott & Karas

[57] ABSTRACT

An n-type III-V compound semiconductor comprises a plurality of monolayers of III-V compound semiconductor molecules having a layer-by-layer structure of group III element and group V element laminated alternately, and a group VI element-doped monolayer. The group VI element-doped monolayer is inserted into the III-V compound semiconductor molecules by occupying lattice points which were occupied by the group V element. The layers of the semiconductor are grown by Atomic Layer Epitaxy process.

3 Claims, 3 Drawing Sheets

DOPING III–V COMPOUND SEMICONDUCTOR DEVICES WITH GROUP VI MONOLAYERS USING ALE

BACKGROUND OF THE INVENTION

The present invention relates to epitaxial layer structures of III–V compound semiconductors and more particularly to a thin film crystal having a planar doping structure and the method of growing the doped epitaxial layer structure.

As a high speed field-effect transistor (FET) based on III–V compound semiconductors, so called delta-doped, or planar-doped, FET is known. In IEEE Transaction on Electron Devices, Vol. ED-33, No. 5, May 1986, pp. 625–632, only a selected layer of GaAS is doped with silicon (Si) as an n-type impurity element while the GaAs epitaxial layer is grown by molecular beam epitaxy (MBE). Such delta-doped FET has a Dirac-delta-function-like doping profile, and has advantages of high gate-breakdown voltage and the high transconductance.

However, it is difficult to achieve an accurate control of the thickness of the epitaxial layer. Accordingly, it is extremely difficult to define the doping position in the order of atomic layer thickness at an arbitrary depth and thus its reproducibility is poor. Although Si can become the n-type impurity by occupying the Ga lattice points in the GaAs crystal, bonding strength between Si and As surrounding Si is not so strong when the crystal growth is carried out by the MBE technique, and thus high doping density is difficult to achieve with good reproducibility. Furthermore, the MBE growth tends to cause surface defects which have caused problems for high-speed LSI application.

SUMMARY OF THE INVENTION

One object of the present invention is to provide a new structure of n-type III–V compound semiconductor having at least one planar doping layer at a precise position.

Other object of the present invention is to provide a method of producing the n-type III–V compound semiconductor by using Atomic Layer Epitaxy (ALE) growth.

According to the present invention, there is provided a new structure of n-type III–V compound semiconductor which comprises a plurality of monolayers of III–V compound semiconductor molecules having a layer-by-layer structure of group III element and group V element laminated alternately, and a group VI element-doped monolayer inserted into the III–V compound semiconductor molecules in which lattice points to be occupied by the group V element are replaced by the group VI element.

Furthermore, according to the present invention, there is provided a method of producing a group VI element-doped III–V compound semiconductor which comprises a first step of growing a plurality of monolayers of III–V compound semiconductor molecules on a III–V compound substrate; a second step of growing a single layer of group VI element on the III–V monolayers so as to occupy the lattice points for group V element by means of Atomic Layer Epitaxy process; and a third step of growing a plurality of monolayers of III–V compound semiconductor molecules on the group VI element-doped layer by means of the Atomic layers Epitaxy process.

As for the III–V compound semiconductors, GaAs, InP, GaP and InAs are preferable and selenium (Se) and sulfur (S) are preferred to be used as the group VI element.

DESCRIPTION OF THE PREFERRED EMBODIMENTS

Figure 1:
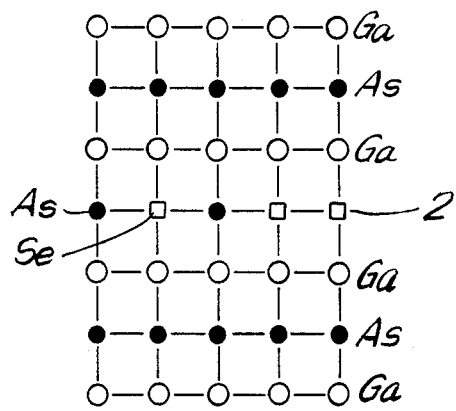
FIG. 1 shows a lattice structure of GaAs having Se-doped single atomic layer.

Referring to FIG. 1, single atomic layer of galium (Ga) and single atomic layer of arsenic (As) are alternately laminated to form a GaAs epitaxial structure which represents III–V compound crystal. In FIG. 1, a part of lattice points which should be occupied by As in one of atomic layers of As is occupied by VI group element such as selenium (Se). Prior to doping Se into GaAs crystal, the GaAs epitaxial structure is manufactured by using a recently developed new technique of Atomic Layer Epitaxy (ALE) by hydride vapor phase epitaxy (VPE).

The principle of the ALE is described by Tuomo Suntara in "Extended Abstract of the 16th (1984 International Conference on Solid Devices and Materials, Kobe, pp. 647–650". A GaAs epitaxial structure grown by the ALE, is also reported by A. Usui et al. in "Japanese Journal of Applied Physics, vol. 25, No. 3, March, 1986, pp. L212–L214", in which GaAs ALE is demonstrated in hydride vapor phase expitaxy by a dual-grown-chamber method. GaAs substrate is alternatively exposed to GaCl and $As_4$ gases by transferring the substrate between two chambers.

More specifically, after adsorpting a single molecular layer of GaCl on the surface of the GaAs substrate by providing GaCl gas onto the GaAs surface in one growth-chamber, $AsH_3$ gas is provided on the GaCl layer in another growth-chamber, and thereby desorpting Cl as HCl gas from the GaCl layer while the As is adsorpted on the remaining Ga monolayer to form As monolayer and thus GaAs monolayer is grown. Repeating those process, desired number of GaAs monolayers are grown.

According to the present invention, new planar doping technique is employed to make GaAs ALE structure n-type conductivity. Instead of adopting IV group element such as Si, VI group element such as Se is used as an impurity element and Se monolayer is grown by ALE. Prior to Se doping step, GaCl monolayer is adsorpted on the As monolayer, and then H$_2$Se gas is provided to adsorp Se onto Ga by desorpting Cl as HCl gas from GaCl monolayer. After this doping step, conventional GaAs ALE is performed again to sandwich the se-doped monolayer between GaAs monolayers. Experiment revealed the fact that this new Se doping technique is effective to achieve high sheet carrier concentration.

According to the present invention, as shown in FIG. 1, a part of lattice point to be occupied by As is replaced by Se.

After growing Se monolayer, GaCl gas is again provided to adsorp GaCl monolayer on the Se-doped monolayer, and AsH$_3$ gas is provided to form GaAs monolayer onto Se-doped monolayer 2. Again, GaAs ALE is repeated to have a desired thickness. Therefore, the structure of Se-doped monolayer 2 sandwiched between GaAs monolayers is new structure.

EXAMPLES

The following examples are given to further illustrate the present invention. The scope of the invention and the field of its application are not, however, limited by these examples.

EXAMPLE 1

Figure 2:
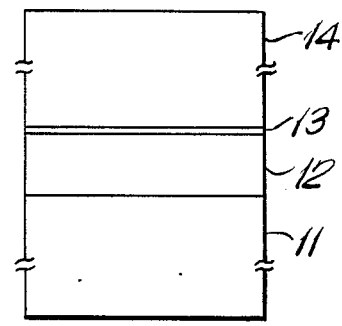
FIG. 2 shows a cross-sectional view of basic structure having a single delta-doped epitaxial crystal according to a first embodiment of the present invention.
Figure 3:
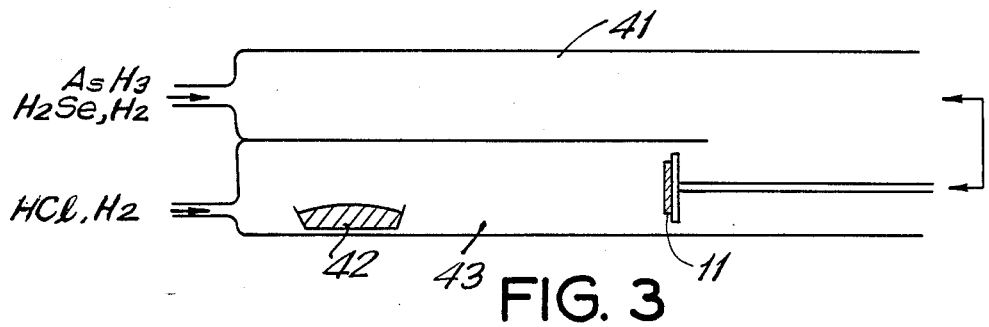
FIG. 3 shows a dual-growth chamber used in this invention.

Referring to FIG. 2, a Se-doped monolayer 13 is inserted into GaAs ALE structure by means of ALE with by using dual-growth-chamber as shown in FIG. 3. A semi-insulating (100) GaAs substrate is used as a substrate crystal 11. At first, substrate 11 is located in the chamber 41 and heated to a growth temperature of 450° C. After the temperature of the chamber reached to the growth temperature, HCl gas is introduced along with H$_2$ carrier gas into chamber 43 wherein Ga source 42 is located to generate GaCl gas. The flow rates of HCl and H$_2$ are 1 cc per minute and 4700 cc per minute, respectively. When the atmosphere becomes stable, the substrate 11 is transferred from chamber 41 to chamber 43. After exposing the substrate 11 to GaCl gas for about ten seconds, the substrate 11 is transferred to the chamber 41. Then AsH$_3$ gas is introduced along with H$_2$ carrier gas into the chamber 41. The flow rate of AsH$_3$ gas is 5 cc per minute and the substrate 11 is exposured to the AsH$_3$ gas for about ten seconds to grow a monolayer of GaAs molecule. Foregoing first process is repeated and GaAs region 12 consisting of 35 monolayers of GaAs molecule is grown.

After that, the substrate 11 is transferred into the chamber 43 to adsorp the GaCl molecular layer on As monolayer, and then the substrate 11 transferred to the chamber 41 wherein the AsH$_3$ gas is replaced by H$_2$Se gas. The flow rate of H$_2$Se gas is 0.2 cc per minute and exposure time is about 10 seconds to grow Se-doped monolayer 13. After that, 300 layers of GaAs monolayers 14 grown by ALE on the Se-doped monolayer 13.

The distribution of carrier concentration in the direction of the depth of the Se-doped n-type GaAs structure obtained from the Example 1 is very steep. The measurement by current-voltage method indicated that half-value width of carrier concentration of Se-doped monolayer 13 was about 8 nm.

The growth condition is not limited to the above stated case. According to the present invention, the layer thickness hardly be changed even if the flow rate of respective gas were reduced to lower values such as 0.1 cc/min. for HCl (Ga), 1 cc/min. for AsH$_3$, 0.01 cc/min. for H$_2$Se and 500 cc/min. for H$_2$. There is no upper limit, but in view of economical reason or so, desirable range of the flow rate are as follows:

| | |
|---|---|
| HCl (Ga) | 0.2–5 cc/min. |
| AsH$_3$ | 3–25 cc/min. |
| H$_2$Se | 0.02–1 cc/min. |
| H$_2$ | 1000–10000 cc/min. |

Furthermore, the layer thickness hardly be changed even if the exposure time of about 10 seconds were reduced to about one second, which is enough time to adsorp the atoms. In this way, according to the present invention, thickness control can be controlled with a precise reproducibility.

Figure 4:
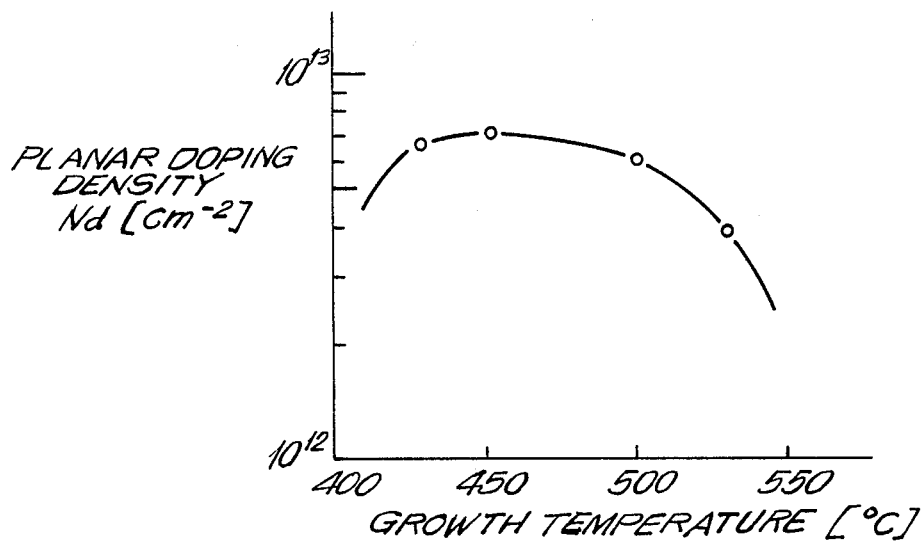
FIG. 4 shows the relationship between growth temperature and planar doping density (Nd).

On the other hand, the control of the Se planar doping density (Nd) can be determined by defining the growth temperature. When the temperature is 450° C., Nd is $7.0 \times 10^{12}$ cm$^{-2}$ and the Nd is $6.0 \times 10^{12}$ cm$^{-2}$ at 500° C. and Nd of $4.0 \times 10^{12}$ cm$^{-2}$ is obtained at 530° C. as shown in FIG. 4.

When the temperature exceeds more than 550° C., the value of Nd decreases. In the same manner, when the temperature becomes less than 420° C., the value of Nd is decreased rappidly too. Accordingly, the control of the Nd in the range of $4 \times 10^{12}$ cm$^{-2}$ to $7 \times 10^{12}$ cm$^{-2}$ can be controlled easily by determining the growth temperature in the range of 420° C.–550° C. Specially, in the range of between 430° C. and 480° C., the value of Nd can be controlled to be about $7 \times 10^{12}$ cm$^{-2}$ and as in the example of 450° C., the Nd can be determined stably with a good reproducibility.

Next EXAMPLE describes that delta-doped GaAs FETs have been fabricated for the first time by Atomic Layer Epitaxy. They exhibit excellent controllability of device parameters and high transconductance and high cutoff frequency.

EXAMPLE 2

Figure 5:
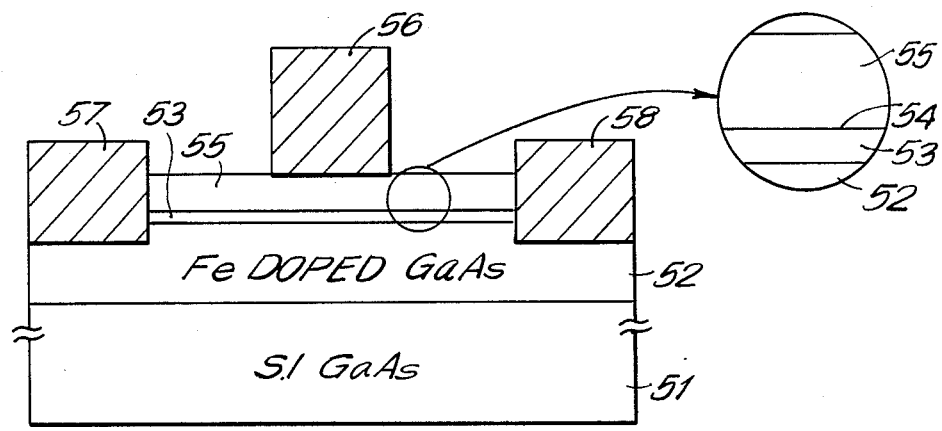
FIG. 5 shows a cross-sectional view of a delta-doped FET structure according to the second embodiment of the present invention.
Figure 6:
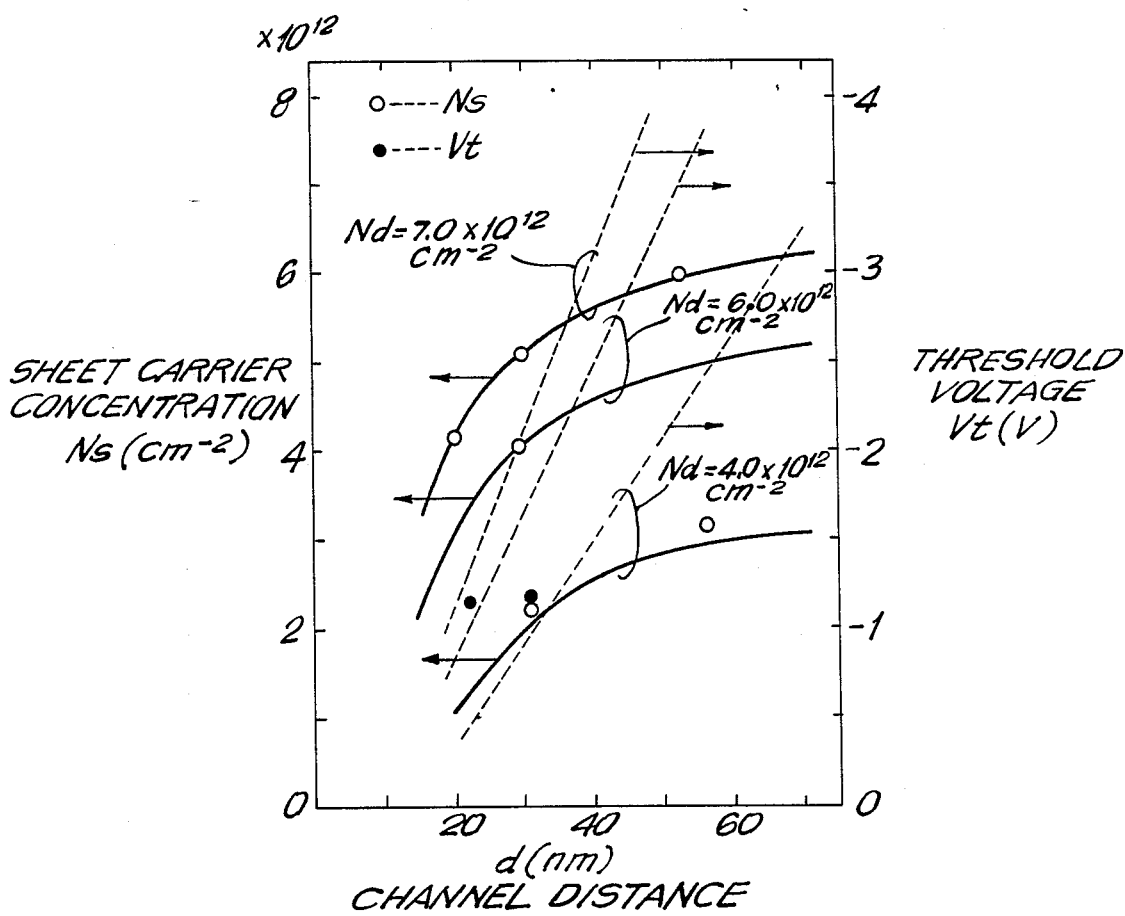
FIG. 6 shows threshold voltage and sheet carrier concentration as a function of gate-to-channel distance with parameters of planar doping density.

The device structure of the delta-doped FET is shown in FIG. 5. A Fe-doped high-resistivity buffer layer 52 was grown on a semi-insulating (100) GaAs substrate 51 by conventional VPE method, first, then the delta-doped layers were grown by Atomic Layer Epitaxy (ALE) in the same hydride VPE system used in EXAMPLE 1. These delta-doped structures comprise one GaAs monolayer 54, containing Se donor atoms (Nd=$4$–$7 \times 10^{12}$ cm$^{-2}$), and GaAs undoped ALE layers 53 and 55, as shown in FIG. 5. Gate-to-delta doped channel distance d was 22 nm by choosing the number of monolayers of GaAs layers 55 to be 78. Delta doped channel-to-Fe doped buffer layer distance was 10 nm by choosing the number of monolayers of GaAs layers 5–3 to be 35. The delta-doped FETs were fabricated by using conventional contact lithography. Gate metal 56 is aluminum. Ohmic contacts 57, 58 are formed by alloying Ni-AuGe to the delta-doped channel at 430° C. Source-to-gate and gate-to-drain distances are 0.5 μm. FIG. 6 shows sheet carrier concentration Ns (cm$^{-2}$) and threshold voltage Vt(V) as a function of delta-doped channel-to-gate distance d (nm) with parameters of planar doping density Nd (cm$^{-2}$). From the approximation that electrons exist only at the Se doped plane, sheet carrier concentration Ns can be determined to be $$Ns = Nd - (\epsilon/qd)\phi_B \quad (1)$$

Threshold voltage Vt for a long gate FET can be determined to be $$V_t = \phi_B - (qd/\epsilon)N_d \quad (2)$$

where $\phi_B$ is the Schottky barrier height, d is delta-doped channel-to-gate distance, and $\epsilon$ is dielectric permittivity. Solid-line and dotted-line represent Vt and Ns values, calculated by equations (1) and (2), respectively. Closed circles and open circles represent experimental data determined by hall measurements and long gate FET properties. Calculated values agree well with measured values. These results indicate the excellent controllability of the delta-doped structure and Atomic Layer Epitaxy for the device parameters.

As shown in FIG. 6, the sheet carrier concentration Ns of the epitaxially grown layer according to the present invention is determined by the values of the Nd and the d. The Nd can be constant when the growth temperature is determined, while the distance d can be defined precisely by the ALE growth, thus it is apparent that doped epitaxial layer due to the present invention can be produced with good reproducibility as a desired crystal.

According to drain current-voltage characteristics for the 0.5 μm gate delta-doped FET at room temperature, drain current decreases linearly with gate reverse voltage, down to the pinch off voltage. This shows the delta-doped channel characteristic, i.e. small change in depletion depth with the gate voltage. The highest transconductance at room temperature was 215 mS/mm. In this delta-doped structure, Se planar doping density was $6.0 \times 10^{12}$ cm$^{-2}$, gate-to-channel distance d was 22 nm, electron mobility in the delta-doped channel was 1700 cm$^2$/V.s. Sheet resistance for the delta-doped channel is 2.5 KΩ/□. Contact resistance (Rc) for ohmic metals to this channel was 1.5 Ω·mm. Total source resistance was 2.7 Ω·mm. This value is relatively large, compared with a conventional MESFET. It may be due to the difficulty involved in causing ohmic metals to make contact with the delta-doped channel. Taking into account the total source resistance, intrinsic transconductance $g_{mo}$ was very high of 510 mS/mm. Saturation velocity, estimated under the short-channel approximation, was $1.0 \times 10^7$ cm/s. This value was equal to that for high-speed GaAs MESFETs.

Figure 7:
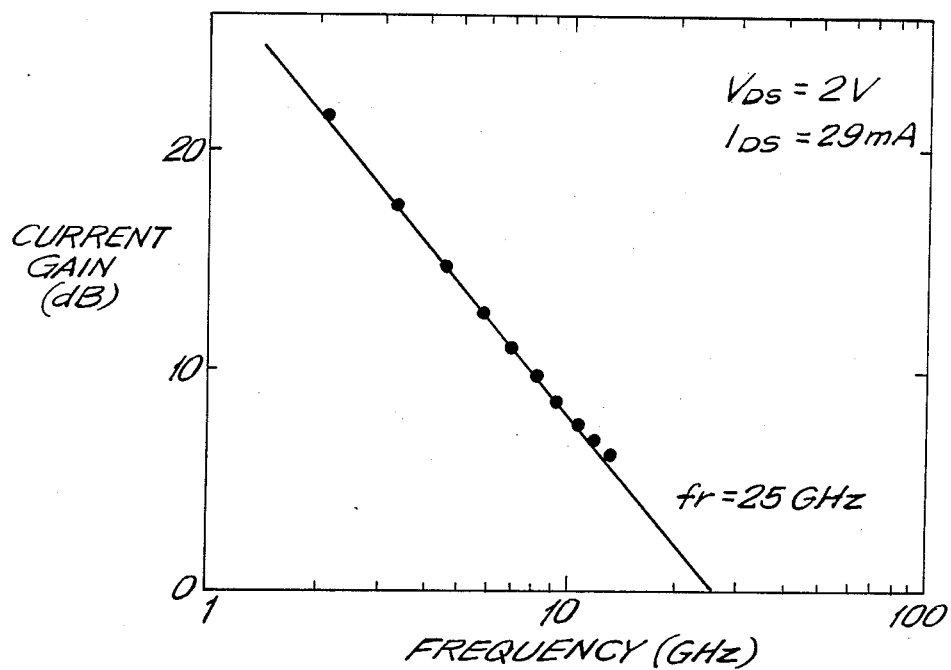
FIG. 7 shows the relationship between frequency and current gain for the delta-doped FET shown in FIG. 5.

S-parameter measurements were carried out for a 0.5 μm gate delta-doped FET with 200 μm gate width at Vds=2 V and Ids=29 mA. Current gain $H_{21}$ dependence on frequency was plotted in FIG. 7. Cutoff frequency $f_t$, obtained by extrapolating the data, was 25 GHz. This value is noticeably larger than that for previously reported delta-doped FETs fabricated by MBE and equal to the value for conventional GaAs MESFETs of the same geometry. These results show that a high quality delta-doped channel is formed by Atomic Layer Epitaxy with the Hydride VPE system.

EXAMPLE 3

Figure 8:
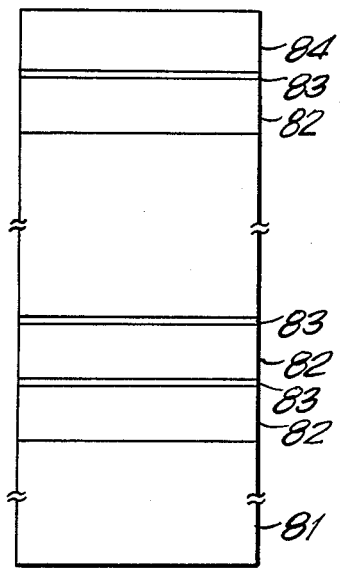
FIG. 8 shows a cross-sectional view of a multi-delta-doped epitaxial structure according to the third embodiment of the present invention.

Referring to FIG. 8, a Se-doped monolayer is respectively inserted into GaAs ALE structure at different position by using dual-growth-chamber as shown in FIG. 3. The same ALE techniques as used in Example 1 is employed by using the same dual-growth-chamber under the same flow retes. The first GaAs region 82 of 9 layers of GaAs monolayers is grown on (100) GaAs substrate 81. A single layer of se-doped monolayer 83 is formed on the GaAs region 82. Both processess for growing GaAs region 82 and Se-doped monolayer 83 are repeated 20 times and then ten monolayers of GaAs molecule region 84 is grown by AIE on top of the Se-doped monolayer 83.

When the sheet carrier density of thus obtained GaAs structure having a plurality of Se-doped monolayers is measured by hall measurement (Van der pauw method), high sheet carrier concentration of $7-8 \times 10^{18}$ cm$^{-3}$ is observed.

In the multi-layered structure shown in FIG. 8, there is an advantage of having a lower resistance. It was also found that the constant carrier concentration can be obtained by inserting Se-doped layer at every ten to fifteen layers of GaAs.

In view of the low resistivity, the embodiment of FIG. 8 could be used as contact region of source and drain of delta-doped FET shown in FIG. 5, by using selective growth technique.

EXAMPLE 4

In this example, InP substrate is used instead of GaAs substrate as shown in example 1. Ga source is replaced by In and AsH$_3$ gas is replaced by PH$_3$ gas. The respective gas flow rate are as follows:

| | |
|---|---|
| HCl (In): | 1 cc/min. |
| PH$_3$: | 5 cc/min. |
| H$_2$Se: | 0.2 cc/min. |
| H$_2$: | 4700 cc/min. |

Thus obtained Se-doped epitaxial layer of InP show the same carrier concentration profile as is the case of example 1.

Other III–V compound such as GaP and InAs can be expected to be applied to the same process of the foregoing examples.

EXAMPLE 5

As the doping element of Group VI, sulfur(s) is used instead of Se.

H$_2$S gas is used instead of H$_2$Se gas of example 1. Other growth condition are the same as in the case of example 1 as follows:

| | |
|---|---|
| Hcl (Ga): | 1 cc/min. |
| AsH$_3$: | 5 cc/min. |
| H$_2$S: | 0.2 cc/min. |
| H$_2$: | 4700 cc/min. |

Even if the S-doped GaAs is grown in the same manner in the case of example 1, carrier concentration is some what decreased compared with the case of the Se-doped GaAs. It was found that the Se is superior to S in view of the controllability.

As is described above, the location of planar doping can be strictly controlled in the order of single atomic layer or single molecular layer, and furthermore, group VI element doping at high density can be effectively achieved with good reproducibility. Fabricated device indicates the high potentiality of using the delta-doped structure and ALE for submicron devices.

What is claimed is:

1. Method of producing n-type III–V compound semiconductor comprising: a first step of growing a plurality of monolayers of III–V compound semiconductor molecules on a III–V compound substrate; a second step of growing a single layer of group VI element on said III-V monolayers so as to occupy lattice points for group V element by means of Atomic Layer Epitaxy process; and a third step of growing a plurality of monolayers of III-V compound semiconductor molecules on the group VI element-doped layer by means of said Atomic Layer Epitaxy process.

2. Method according to claim 1, wherein said III-V compound semiconductor is selected from the group comprising GaAs, InP, CaP and InAs, while said group VI element is selected from the group comprising Se and S.

3. Growing method of Se-doped n-type GaAs crystal comprising;
- a first step of adsorbing a monolayer of GaCl molecule onto GaAs substrate by exposing thereof the GaCl gas,
- a second step of exposing said substrate to $AsH_3$ gas to grow As monolayer onto Ga monolayer by desorbing Cl from said GaCl molecule as HCl gas,
- a third step of repeating said first step and second step consequently to grow a desired number of monolayers of GaAs molecule,
- a fourth step of adsorbing a monolayer of GaCl molecule onto said monolayers of GaAs molecule,
- a fifth step of exposing said substrate after said fourth step to $H_2Se$ gas to grow Se monolayer onto Ga monolayer by desorbing Cl from said GaCl molecule as HCl gas,
- a sixth step of growing GaCl monolayer onto said Se monolayer exposing said substrate after said fifth step to GaCl gas;
- a seventh step of exposing said substrate after said sixth step to $AsH_3$ gas to grow As monolayer onto Ga monolayer,
- a eighth step of exposing said substrate after said seventh step to GaCl gas to grow Ga monolayer onto As monolayer, and
- a ninth step of repeating said seventh step and eighth step alternatively after said eighth step to grow a desired number of monolayers of GaAs molecules.

* * * * *